United States Patent [19]

Denenberg et al.

[11] 3,965,432
[45] June 22, 1976

[54] HIGH RELIABILITY PULSE SOURCE

[75] Inventors: Jeffrey Neil Denenberg, Naperville; Kenneth Peter May, Aurora, both of Ill.

[73] Assignee: Bell Telephone Laboratories, Incorporated, Murray Hill, N.J.

[22] Filed: Apr. 14, 1975

[21] Appl. No.: 567,728

[52] U.S. Cl. ............................... 328/61; 328/104; 307/269; 331/49; 331/56
[51] Int. Cl.² ....................................... H03K 1/12
[58] Field of Search ................... 307/219, 204, 269; 328/61, 104, 154; 331/49, 55, 56

[56] References Cited
UNITED STATES PATENTS

| | | | |
|---|---|---|---|
| 3,116,477 | 12/1963 | Bradbury | 331/49 |
| 3,289,097 | 11/1966 | Martin | 331/49 |
| 3,319,181 | 5/1967 | Tarczy-Hornoch et al. | 331/49 |
| 3,751,685 | 8/1973 | Jaeger | 307/219 |

Primary Examiner—John Zazworsky
Assistant Examiner—Marcus S. Rasco
Attorney, Agent, or Firm—J. C. Albrecht

[57] ABSTRACT

A reliable pulse source circuit utilizing two independent but synchronized pulse generators is disclosed. The pulse source circuit maintains output pulses even though one pulse generator fails regardless of the failure mode, i.e., whether the output of the failed generator is stuck high or stuck low. A toggle flip-flop responsive to the presence and absence of pulses from the two generators and its own state outputs controls gating circuitry to generate a sequence of output pulses wherein alternate output pulses occur in response to pulses of one generator and the remaining output pulses occur in response to pulses of the other generator, and if either generator fails, all output pulses occur in response to the pulses of the other generator.

5 Claims, 3 Drawing Figures

HIGH RELIABILITY PULSE SOURCE

FIELD OF THE INVENTION

This invention relates to pulse sources and more particularly to pulse sources utilizing duplicated pulse generators for system reliability.

BACKGROUND OF THE INVENTION

Frequently, vital components are duplicated to improve reliability in systems which must be highly reliable, e.g., telephone systems. Duplicated components provide continued system operation in case of failure and during subsequent repair time.

One such duplicated system component is a clock pulse generator, i.e., a system clock. Presently used clock duplication schemes include diode "OR", majority rule, and switching to a standby clock upon failure of an on-line clock. Each of these schemes suffers from problems and limitations. If two clock circuits are combined by diode "OR" gates, only one clock failure mode can be protected, i.e., the diodes can be arranged to protect against either a stuck-high failure or a stuck-low failure but not both. In a majority rule arrangement three or more clock circuits are compared and combined so that the clock signal of the majority is passed to the output, i.e., at least three clock circuits are required. Finally where a standby clock circuit is switched into operation upon the failure of an on-line clock circuit, both clocks must be monitored to ensure reliability and several clock pulses may be lost during the switch with resulting system disruption.

SUMMARY OF THE INVENTION

In accordance with our invention a pulse source comprises two independent but synchronized pulse generators and control circuitry responsive to the output signals of the pulse generators to provide a sequence of periodic output pulses wherein, in the absence of a fault, alternate pulses of the sequence occur in response to pulses of one of the two generators and the remaining pulses of the sequence occur in response to pulses of the other generator; and in the event of a failure of either generator, all succeeding output pulses of the sequence occur in response to the pulses of the other generator until such time as the failed generator is restored to service.

Advantageously, our invention provides an output upon failure of either pulse generator regardless of the failure mode, i.e., whether the output of the failed generator is stuck high or stuck low.

BRIEF DESCRIPTION OF THE DRAWING

The invention will be understood from the following detailed description when read with reference to the drawing in which.

DETAILED DESCRIPTION

Figure 1:
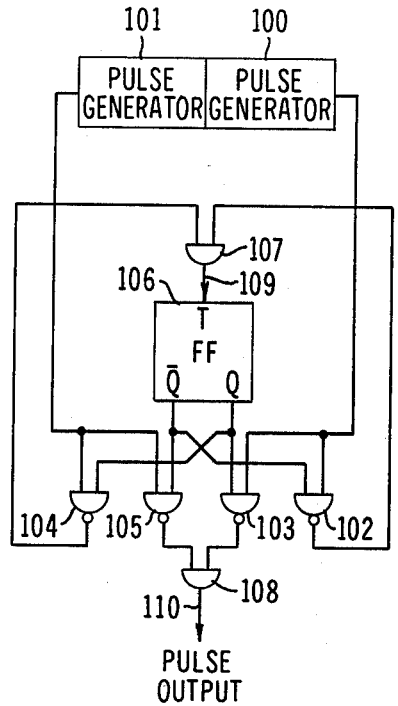
FIG. 1 is a schematic diagram of a pulse source circuit.

A pulse source circuit according to our invention is shown in FIG. 1. Pulse generators 100 and 101 are independent but synchronized sources of periodically occurring pulses. The toggle flip-flop 106 changes from the set state (output Q high, output $\overline{Q}$ low to the reset state (output Q low, output $\overline{Q}$ high) or from the reset state to the set state when a low to high transition occurs at its toggle input conductor 109. The Q and $\overline{Q}$ outputs of the flip-flop 106 are connected to the NAND gates 102 through 105 so that for one state of the flip-flop 106 an output pulse of one generator controls the generation of a pulse on the output conductor 110 and an output pulse of the other generator controls the generation of a pulse on the toggle input conductor 109 to flip-flop 106. The roles of the two generators are reversed for the other state of the flip-flop 106.

If the flip-flop 106 is in the set state ($\overline{Q}$ low) the output signals of NAND gates 102 and 105 will be high which in turn causes output pulses of generator 100 to control the signals on the output conductor 110 via NAND gate 103 and AND gate 108 and output pulses of generator 101 to control the signals on the toggle input conductor 109 via NAND gate 104 and AND gate 107. When the flip-flop 106 is in the reset state (Q low) the output signals of the NAND gates 103 and 104 will be high which in turn cause output pulse of generator 101 to control the signals on the output conductor 110 via NAND gate 105 and AND gate 108 and output pulse of generator 100 to control the signals on the toggle input conductor 109 via NAND gate 102 and AND gate 107.

Figure 2:
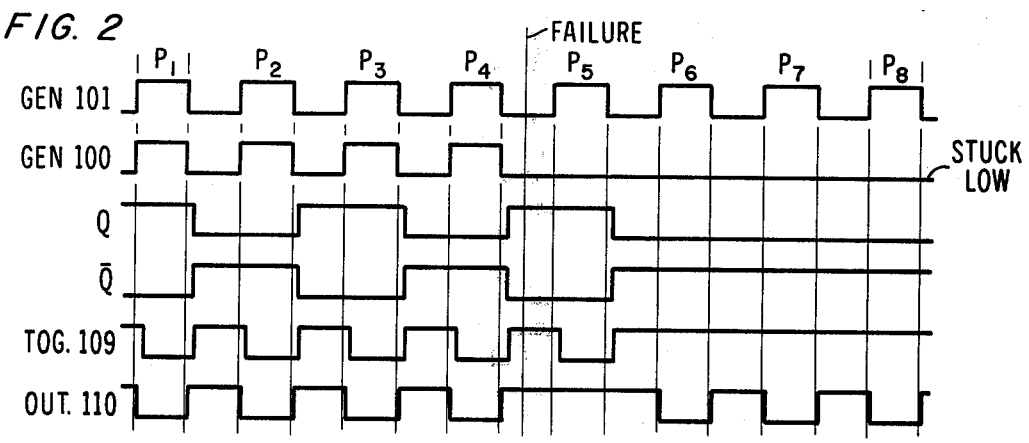
FIG. 2 is a timing chart showing circuit operation upon failure of one pulse generator in a stuck-low mode.
Figure 3:
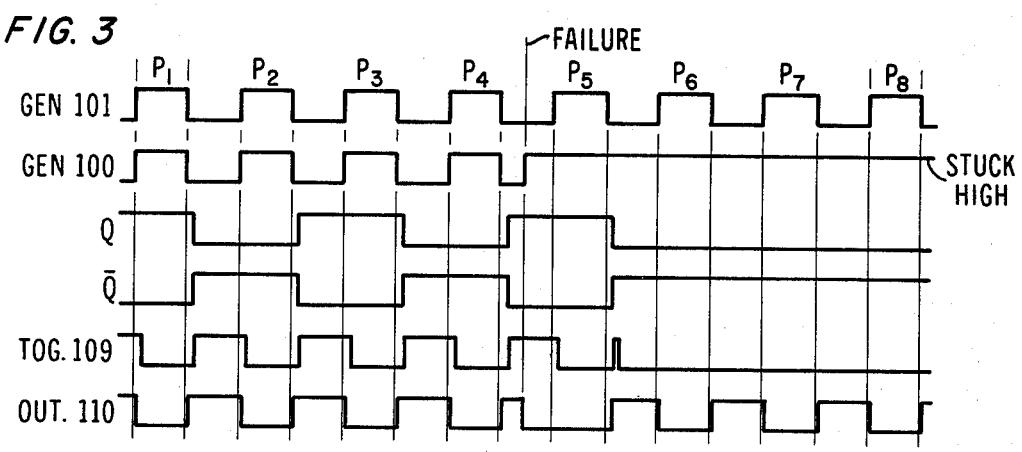
FIG. 3 is a timing chart showing circuit operation upon failure of one pulse generator in a stuck-high mode.

Circuit operation in the absence of a circuit fault is illustrated by the first four pulses of FIGS. 2 and 3 in which the initial state of the flip-flop 106 is arbitrarily shown as the set state. Pulses P1 from the generators 100 and 101 will not affect the NAND gates 102 and 105 since $\overline{Q}$ is low, however, the output signals of the NAND gates 103 and 104 will be low in response to coincident high input signals. Thus, the signal at the output conductor 110 will go low in response to a high output signal of generator 100 and the signal at the toggle input conductor 109 will go low in response to a high output signal of generator 101. Termination of the P1 pulses places low signals on one input of each of the NAND gates 102 through 105 which cause their output signals to be high and the signals at the output conductor 110 and at the toggle input conductor 109 to go high. The low to high transistion of the signal on the toggle input conductor 109 effects a change of state of the flip-flop 106 and in the example of FIGS. 2 and 3 serves to place flip-flop 106 in the reset state. This state change has no effect on the signals at the output conductor 110 or at the toggle input conductor 109 because the output signals of the NAND gates 102 through 105 are held high by the low output signals from the generators.

Because the flip-flop 106 is reset by the termination of the P1 pulses, the P2 pulses cannot affect the output signals of the NAND gates 103 and 104 since Q is low, however, the output signals of the NAND gates 102 and 105 will both be low in response to coincident high input signals. Thus, with flip-flop 106 in the reset state the signal at the output conductor 110 will go low in response to a high output signal of generator 101 and the signal at the toggle input conductor 109 will go low in response to a high output signal of generator 100. Termination of the P2 pulses again places low signals on one input of each of the NAND gates 102 through 105 which causes their outputs to be high and the signals at the output conductor 110 and at the toggle input conductor 109 to go high. The low to high transition of the signal at the toggle input conductor 109 effects a change of state of the flip-flop 106 and in the example of FIGS. 2 and 3 serves to place the flip-flop 106 in the set state. This state change has no effect on the signals at the output conductor 110 or at the toggle input conductor 109 because the output signals of the NAND gates 102 through 105 are held high by low output signals from the generators.

In the absence of a failure, circuit operation for later pulses will be identical to that for the P1 and P2 pulses; when the flip-flop 106 is in the set state, operation will correspond to that for the P1 pulses and when the flip-flop 106 is in the reset state, operation will correspond to that for the P2 pulses.

Circuit operations upon failure of pulse generator 100 in a stuck-low mode, i.e., its output signal is stuck low, and a stuck-high mode, i.e., its output signal is stuck high, are shown in FIGS. 2 and 3, respectively. The failures of pulse generator 100 in FIGS. 2 and 3 have been introduced at times which illustrate maximum disruption of the output signal and it should be noted that such disruption can range from this maximum to no disruption at all dependent upon the time a failure occurs within the operating sequence.

In FIG. 1, if pulse generator 100 fails in the stuck-low mode, the output signals of the NAND gates 102 and 103 will be held high. Therefore, the output signals of the NAND gates 104 and 105 will control the signals at the toggle input conductor 109 and at the output conductor 110, respectively. If the flip-flop 106 is in the reset state when the stuck-low failure of generator 100 occurs, there will be no disruption of the signal at the output conductor 110 since the signal of generator 101 controls the signal at output conductor 110. The signal at the toggle input conductor 109 will be held high by the continuing low input signals to the NAND gates 102 and 104. Therefore, the flip-flop 106 will not be set and the generator 101 will continue to control the signal at the output conductor 110 as long as the output signal of generator 100 remains low.

If the flip-flop 106 is in the set state when the stuck-low failure of generator 100 occurs, the signal at the output conductor 110 will be held high until the flip-flop 106 is reset. With the flip-flop 106 in the set state, the signal of generator 101 controls the signal at the toggle input conductor 109 to reset the flip-flop 106. After the flip-flop 106 is in the reset state, circuit operation is as detailed in the preceding paragraph.

In FIG. 1 if pulse generator 100 fails in the stuck-high mode, the output signals of NAND gates 102 and 103 will be controlled by the flip-flop 106. If the flip-flop 106 is in the reset state when the stuck-high failure of generator 100 occurs, there will be no disruption of the signal at the output conductor 110 since the signal of generator 101 controls the signal at the output conductor 110. The signal at the toggle input conductor 109 will be held low by coincident high input signals to the NAND gate 102. Therefore, the flip-flop 106 will not be set and generator 101 will continue to control the signal at the output conductor 110 as long as the output signal of generator 100 remains high.

If the flip-flop 106 is in the set state when the stuck-high failure of generator 100 occurs, the signal at the output conductor 110 will be held low until the flip-flop 106 is reset. With the flip-flop 106 in the set state, the signal of generator 101 controls the signal at the toggle input conductor 109 to reset the flip-flop 106. After the flip-flop 106 is in the reset state, circuit operation is as detailed in the preceding paragraph.

Operation of the pulse generating circuit upon failure of pulse generator 101 is analogous to failure of pulse generator 100 as can be seen from the symmetry of the pulse source circuit of our invention.

What is claimed is:

1. A pulse source circuit for providing a sequence of output pulses wherein, in the absence of a failure in the pulse source circuit, alternate output pulses occur in response to signals of one generator and the remaining output pulses occur in response to signals of another generator and, in the presence of a failure of either one of the generators, all output pulses occur in response to signals of the remaining generator comprising:
    two independent but synchronized generators of repetitive signals;
    a pulse output terminal;
    bistable means for generating control signals at first and second output terminals in response to control signals at a control input terminal;
    first gating means having input terminals connected to said generators and to said first and second output terminals of said bistable means for providing at said pulse output terminal a sequence of pulses in response to output signals of said generators and to said control signals; and
    second gating means having input terminals connected to said generators and to said first and second output terminals of said bistable means for generating signals at said control input terminal for controlling the states of said bistable means in response to output signals of said generators and to said control signals.

2. A pulse source circuit in accordance with claim 1 wherein said bistable means comprises a toggle flip-flop.

3. A pulse source circuit for providing a sequence of output pulses wherein, in the absence of a failure in the pulse source circuit, alternate output pulses occur in response to signals of one generator and the remaining output pulses occur in response to signals of another generator and, in the presence of a failure of either one of the generators, all output pulses occur in response to signals of the remaining generator comprising:
    first and second independent but synchronized generators of repetitive signals;
    a pulse output terminal;
    bistable means for generating control signals at first and second output terminals responsive to control signals at a control input terminal;
    first gating means having input terminals connected to said generators and to said first output terminal of said bistable means for providing at said pulse output terminal a sequence of pulses in response to output signals of said first generator and for generating signals at said control input terminal of said bistable means for switching the states of said bistable means in response to output signals of said second generator; and
    second gating means having input terminals connected to said generators and to said second output terminal of said bistable means for providing at said pulse output terminal a sequence of pulses in response to output signals of said second generator and for generating signals at said control input terminal of said bistable means for switching the states of said bistable means in response to output signals of said first generator.

4. A pulse source circuit in accordance with claim 3 wherein said bistable means comprises a toggle flip-flop.

5. A pulse source circuit for maintaining a sequence of pulses in the presence of a failure of one pulse generator whose output signal is either stuck high or stuck low comprising:
- a pulse output terminal;
- two independent but synchronized generators of repetitive signals;
- a toggle flip-flop having a control input terminal and first and second complementary output terminals;
- first and second NAND gates having inputs connected to said first generator;
- third and fourth NAND gates having inputs connected to said second generator;
- said first and third NAND gates also having inputs connected to said first output terminal of said toggle flip-flop and said second and fourth NAND gates also having inputs connected to said second output terminal of said toggle flip-flop;
- a first AND gate having inputs connected to the outputs of said second and third NAND gates and having an output connected to said output terminal; and
- a second AND gate having inputs connected to the outputs of said first and fourth NAND gates and having an output connected to said control input terminal of said toggle flip-flop.

* * * * *